United States Patent [19]

Jeuch

[11] Patent Number: 5,011,787
[45] Date of Patent: Apr. 30, 1991

[54] PRODUCTION OF AN INTEGRATED MEMORY CELL

[75] Inventor: Pierre Jeuch, Seyssins, France

[73] Assignee: Commissariat a L'Energie Atomique, Paris, France

[21] Appl. No.: 376,626

[22] Filed: Jul. 7, 1989

[30] Foreign Application Priority Data

Jul. 13, 1988 [FR] France ................. 88 09559

[51] Int. Cl.$^5$ ............................................ H01L 21/70
[52] U.S. Cl. ............................... 437/52; 437/40;
437/43; 437/48; 437/49; 437/61; 437/63;
437/64; 437/190; 437/191; 357/23.5; 357/23.1;
357/23.9
[58] Field of Search ............ 437/52, 48, 190, 191,
437/61, 63, 64, 49, 43; 357/23.5

[56] References Cited

U.S. PATENT DOCUMENTS

| | | | |
|---|---|---|---|
| 4,359,816 | 11/1982 | Abbas et al. | 437/48 |
| 4,373,250 | 2/1983 | Malwah | 437/191 |
| 4,402,128 | 9/1983 | Blackstowe . | |
| 4,409,723 | 10/1983 | Harari | 437/48 |
| 4,597,060 | 6/1986 | Mitchell et al. . | |
| 4,698,900 | 10/1987 | Esquivel | 437/52 |
| 4,742,018 | 5/1988 | Kimura et al. | 437/48 |
| 4,749,443 | 6/1988 | Mitchell et al. | 437/52 |
| 4,766,088 | 8/1988 | Kono et al. | 437/49 |
| 4,849,369 | 7/1989 | Jeuch et al. | 437/52 |
| 4,851,365 | 7/1989 | Jeuch | 437/191 |
| 4,855,248 | 8/1989 | Ariizumi et al. | 437/52 |
| 4,886,763 | 12/1989 | Suzuki | 437/61 |

FOREIGN PATENT DOCUMENTS

| | | | |
|---|---|---|---|
| 0088922 | 9/1983 | European Pat. Off. . | |
| 0160965 | 11/1985 | European Pat. Off. . | |
| 2809233 | 9/1978 | Fed. Rep. of Germany | 437/190 |
| 2809411 | 9/1978 | Fed. Rep. of Germany | 437/190 |
| 0168258 | 10/1983 | Japan | 437/61 |
| 0057450 | 4/1984 | Japan | 437/64 |
| 0149145 | 8/1985 | Japan | 437/61 |
| 0139986 | 1/1986 | Japan . | |
| 0050370 | 3/1986 | Japan . | |

Primary Examiner—Brian E. Hearn
Assistant Examiner—Kevin Picardat
Attorney, Agent, or Firm—Hayes, Soloway, Hennessey & Hage

[57] ABSTRACT

The invention concerns the method to produce an EPROM or EEPROM type integrated memory cell on a semiconductor substrate. The cell comprises memory points, electrically insulated from each other, each memory point comprising a source (4), a drain (6), a floating gate (350), a control grid (38), a channel (5) situated under the floating gate (350), the source (4) and the drain (6) being situated on both sides of the floating (350), the floating gates of each memory point being laterally distant and insulated along a first direction (X) from one or two other floating gates, the production of the cell comprising a stage for embodying lateral insulations (320) of the floating gates along the first direction (X), then a stage for embodying the actual floating gates (350), which makes it possible to obtain insulations between submicronic floating gates.

Application for the embodiment of integrated memory cells.

10 Claims, 4 Drawing Sheets

PRODUCTION OF AN INTEGRATED MEMORY CELL

FIELD OF THE INVENTION

The object of the present invention is to provide a method to produce an integrated memory cell. In particular, it applies to the production of an MOS-technology integrated circuit comprising memories, and especially nonvolatile EPROM type memories, namely electrically programmable memories erasable by being exposed to ultraviolet radiation, or EEPROM type memories, namely electrically erasable and programmable memories.

BACKGROUND OF THE INVENTION

An integrated memory is an integrated circuit comprising an actual memory section called a memory cell formed of several electrically interconnected memory points, as well as peripheral circuits serving to control the memory points.

The sole object of the invention is to produce the actual memory section.

The most modern memory cells allowing for the storing of 10 bits have surface areas of from 20 to 25 $\mu m^2$ in 1.2 $\mu m$ technology, namely in which the smallest tapes and spaces measure 1.2 $\mu m$. The surface area of a memory is thus about 14 to 17 times that of the elementary square of a lithograph ($1200 \times 1200$ $nm^2$).

FIG. 1 diagrammatically shows a perspective view of a known EPROM type memory cell, namely a memory cell electrically programmable solely on reading and erasable by ultraviolet radiation.

As represented on FIG. 1, a memory point is formed of a transistor comprising a source 4, a channel 5 and a drain 6, all embodied in a monocrystalline silicon semiconductive substrate 8; the source and the drain present conductivities opposite those of the substrate.

The transistor also includes a grid nonconductor 10, generally silicon oxide, on which stacked are a first grid 12 and a second grid 14, both generally made of polycrystalline silicon doped with phosphorus. These two grids are separated by a fine insulating layer 16 generally made of silicon oxide.

The first grid 12 is a floating gate and the second grid 14 is the control grid of the memory point.

The memory point is electrically insulated from the other memory points and the peripheral control circuits of this point by means of a field oxide 18 embodied, for example, by the localized and superficial oxidation of the substrate through a mask of silicon nitride.

The entire memory cell is covered with a thick insulating layer 22, usually made of silicon oxide, in which the electric contact holes of the sources and drains, such as 24, are embodied. The electric connections between the sources and drains of the various memory points and/or the various peripheral control circuits are ensured by a conductive layer 26, generally made of aluminium and deposited on the nonconductive layer 22 and suitably engraved.

The electric connections between the control grids of the various memory points are defined at the same time as the control grids 14 and in the same polycrystalline silicon layer.

The applicant has encountered several technical problems in embodying these memory cells.

The first problem relates to integration density.

In fact, efforts are increasingly centered on finding a way to reduce the size of integrated circuits and especially of memories so as to increase their integration density. In currently known memories, efforts to resolve this problem have so far been centered solely on two factors for limiting reduction of the dimensions of the memory cell.

The first factor is the overlapping between the floating gate 12 and the field oxide 18; an overflowing X1 of the floating gate 12 above the field oxide 18 and an overflowing Y1 of the field oxide 18 with respect to the floating gate 12 are necessary owing to the inaccuracy of superimposing the various layers constituting the memory points and lithograph masks required for etching the various layers. These overflowings are respectively in the direction X of the lines of words (or grid connections) of the memory cell and in the direction Y of the channels of the memory points, said direction Y being perpendicular to the direction X.

The second factor is the need to provide insulating guards around the contact holes of the line of bits, namely around the contact holes of the drains of the memory points. One insulating guard X2 is provided in the direction X between the drain contact and the field oxide 18 and another insulating guard Y2 is provided in the direction Y between the drain contact and the grids 12 and 14.

As reduction of the lithographic dimensions is not generally accompanied by any proportional improvement as regards the accuracy of superpositions of different levels, especially of lithographic masks, the limitation factors mentioned above prove to be increasingly inhibitive as regards increasing the integration density of the memories.

Accordingly, a search is made to improve the methods for producing memory cells so as to obtain self-aligning or self-positioning in order to avoid overlapping between the floating gate and the field oxide and/or the insulating guards around the contact holes.

The second problem resides in the fact that the memory cells produced by conventional methods have small points marked by the reference P on FIG. 1. These points are localized at the level of the angles formed by the extreme edges of the grids and the interpoly nonconductor 16.

The third problem resides in the fact that the memory cells embodied by conventional methods have a structure which presents a large relief when it would be preferable to obtain a structure approximating a flat structure.

SUMMARY OF THE INVENTION

The object of the present invention is to provide a method to produce a memory cell making it possible to resolve all these problems and in particular to increase the integration density of the memories by means of reducing their size by reducing the distance X'3 between two floating gates of two memory points, this distance being that taken along the direction of a line of words which is also qualified by the control line.

Thus, the object of the present invention is to provide a method for producing an integrated memory cell on a semi-conductive substrate comprising a matrix of memory points electrically insulated from each other, each memory point comprising a drain, a source, a floating gate, the floating gates of each memory point being laterally distant and insulated along a first direction from one or two other floating gates, said method being mainly characterized in that it comprises a stage for embodying lateral insulations of the floating gates along the first direction, followed by a stage for embodying the actual floating gates.

The method according to the invention consists of using an etching mask comprising patterns defining the length of the floating gates in which the etching mask used comprises one grid pattern out of two, the of the mask having a pitch, which corresponds to two floating gates lengths L', increased by two lengths X3 of spaces separating two floating gates.

Advantageously, the embodiment of the insulations of the floating gates includes a stage for depositing a sacrificial layer, followed by an etching of this layer by means of the mask having one grid pattern out of two and followed by the depositing of an insulating layer and an etching of the nonconductor so as to embody submicronic spacers of the desired width X3 and finally by eliminating the sacrificial layer.

Advantageously, the method comprises the following stages:
(a) firstly:
   formation in the substrate of active zones separated by the thick oxide forming the field oxide insulating the memory points,
   formation of a layer of a material serving to protect the substrate,
   doping of channel regions by ionic implantation through the protection layer,
(b) then embodiment of the lateral insulations by:
   depositing of the sacrificial layer,
   etching of this layer so as to obtain the desired patterns,
   depositing of the thin insulating layer,
   etching of the nonconductor so as to embody the spacers against the lateral edges of the patterns of the etched sacrificial layer,
   elimination of the patterns of the sacrificial layer,
   elimination of the protection layer,
   formation of a thin layer of an insulating material so as to form a grid nonconductor,
(c) embodiment of the floating gates by depositing and etching,
(d) embodiment of the control grids by depositing, masking and etching,
(e) embodiment of the sources and drains,
(f) embodiment of the contacts,
(g) embodiment of interconnections.

Advantageously, the embodiment of the floating gates carried out during stage (c) comprises the following successive sub-stages:
   depositing of a first layer of polycrystalline silicon,
   depositing of a planarization resin layer,
   engraving at identical speed of the resin and the polycrystalline silicon allowing the polycrystalline silicon to be exposed,
   doping of the first layer of polycrystalline silicon.

According to one preferred embodiment, the sacrificial layer is a layer of polycrystalline silicon.

According to one preferred embodiment, the substrate is silicon and the thin layer of the nonconducting material is a silicon oxide layer obtained by oxidation of the silicon forming the substrate.

Advantageously, the protection layer is constituted by the nitride mask used to embody the field oxide.

According to one embodiment, the planarization resin is deposited by hydro-extraction.

According to one embodiment, the embodiment of the floating gates comprises a final stage for eliminating any possible resin residue by means of an oxygen plasma.

According to one embodiment variant, doping of the layer of polycrystalline silicon is carried out immediately after the depositing of this polycrystalline silicon layer.

Advantageously, the embodiment of the control grids carried out during stage (d) comprises the following successive sub-stages:
   embodiment of the inter-grid insulating layer;
   depositing of a second layer of polycrystalline silicon;
   doping of the second layer of polycrystalline silicon;
   etching of this second layer from a mask having defining the control grids;
   partial etching of the insulating layer forming the spacers and the inter-grid insulating layer in the zones where these layers are not overlapped by the second polycrystalline silicon layer;
   selective etching of the first polycrystalline silicon layer with respect to the insulating layer in the zones not overlapped by the second polycrystalline silicon layer.

BRIEF DESCRIPTION OF THE DRAWINGS

Other characteristics and advantages of the invention shall appear more readily from a reading of the following description, given by way of illustration and being in no way restrictive, with reference to the accompanying drawings in which.

DETAILED DESCRIPTION OF THE PREFERRED EMBODIMENTS

The following description relates to an EPROM memory cell. Of course, the method according to the invention can also be applied to EEPROM memory cells. For the purpose of simplification, only an EPROM cell shall be described, said cell formed of memory points on channel N embodied on a p type monocrystalline silicon substrate, the invention having a much more general extent in that it can be applied to any type of floating gate memory embodied on any semi-conductive substrate.

Figure 1:
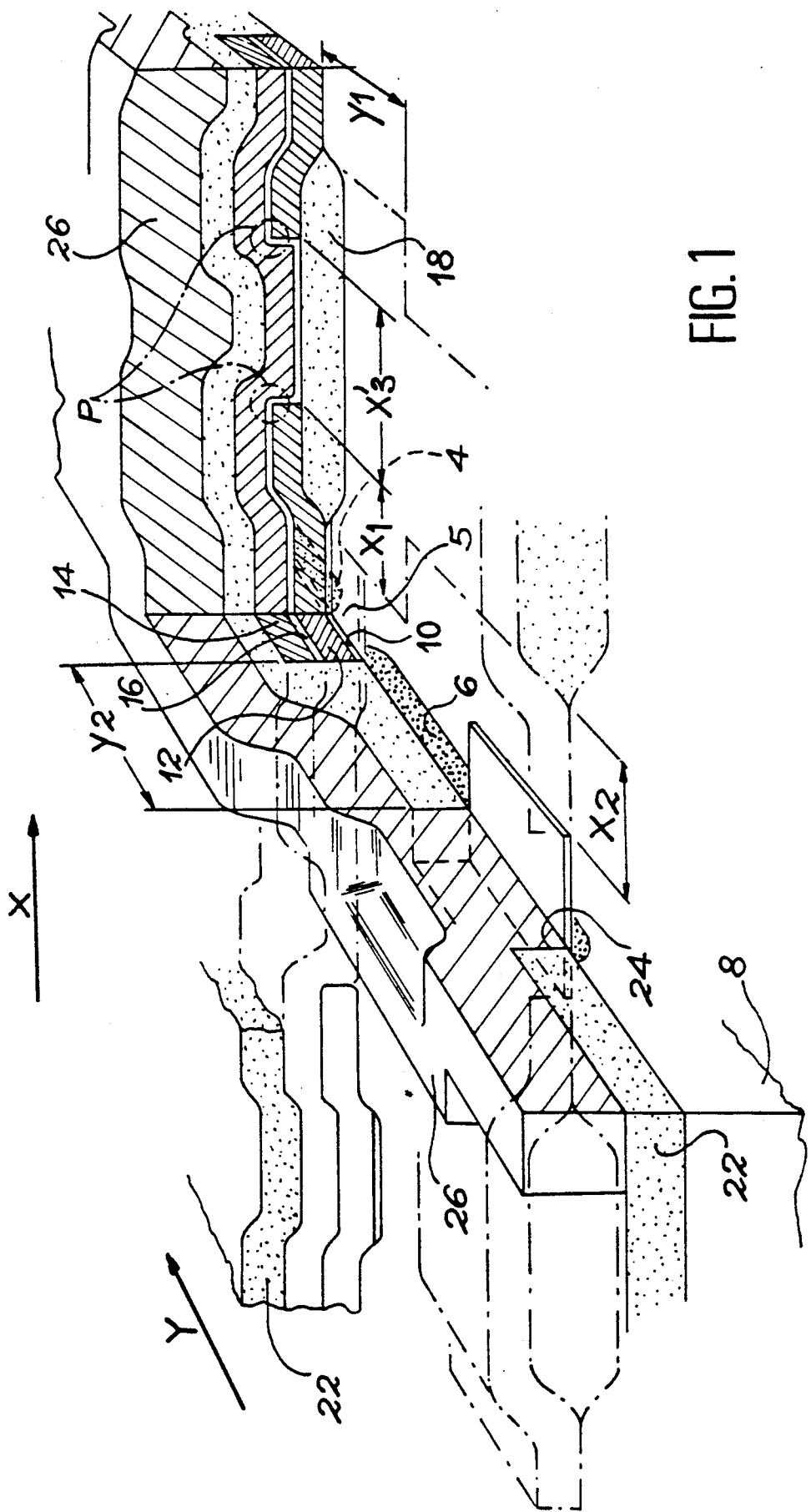
FIG. 1 already described diagrammatically shows a perspective view of an EPROM memory cell according to the prior Art.
Figure 2:
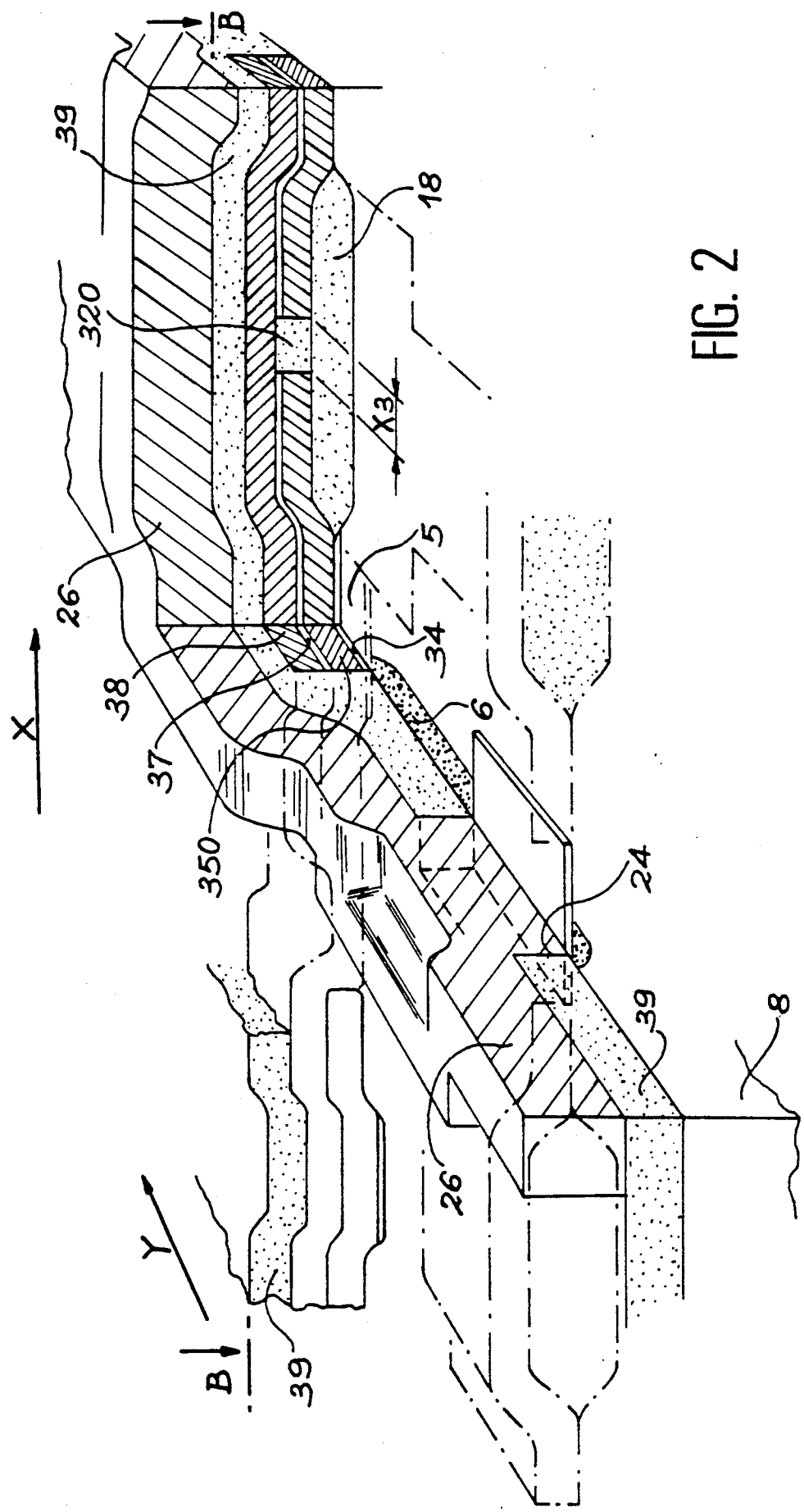
FIG. 2 diagrammatically shows a perspective view of an EPROM memory cell according to the invention.
Figure 3:
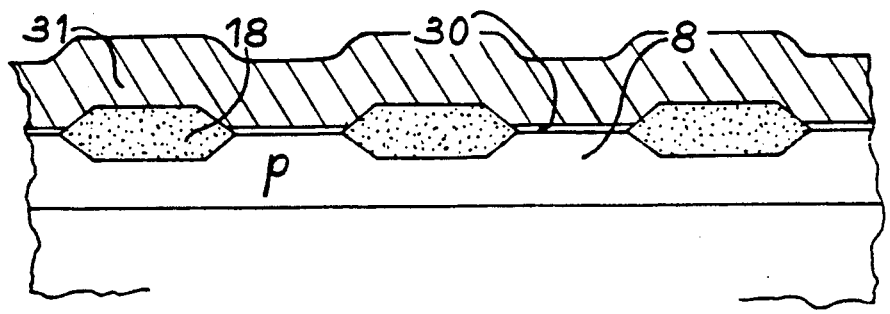
FIGS. 3 to 10 represent the successive intermediate stages of the production method according to the invention.

The EPROM memory cell represented on FIG. 2, just like the memory cell of the prior Art, comprises a matrix of memory points, said matrix formed of transistors, each comprising a source 4, an n+ type drain 6 embodied on a p type monocrystalline silicon substrate 8, material stackings being provided between the source and the drain. These stackings are formed from firstly the substrate 8, followed by a first nonconductor 34 made of silicon oxide, a floating gate 350 made of polycrystalline silicon doped with phosphorus, a second nonconductor 37 formed of three stacked nonconducting materials SiO$_2$, Si$_3$N$_4$ and SiO$_2$ and a polycrystalline silicon control grid 38 doped with phosphorus. These stackings are usually between 600 and 700 nanometers.

So as to electrically insulate the memory points from each other, lateral insulations 18 are provided. These insulations are accompanied by a p+ type doping of the substrate.

The floating gates of each memory point are distant from each other along the direction X. This distance is marked by the reference X3.

In accordance with the production method of the invention, the distance X3 is reduced with respect to the prior Art. The lateral insulation of the grids along this direction X is embodied according to the invention prior to embodiment of the actual floating gates.

Figure 11:
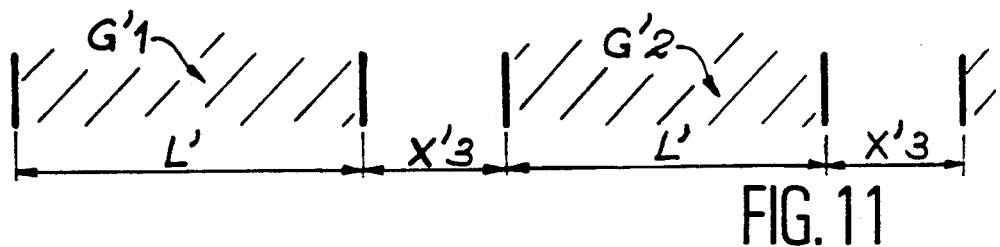
FIG. 11, represents in an extremely simplified way the diagram of an etching mask for the embodiment of floating gates according to the prior Art.
Figure 12:
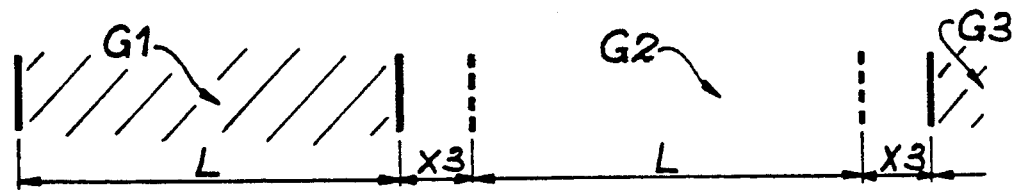
FIG. 12 represents in an extremely simplified way the etching mask used in the method according to the invention in order to embody submicronic spacers.

So as to embody the floating gates, a lithographic etching mask is generally used, said mask having patterns with a given pitch corresponding to the length of a grid to which added is the distance X'3 (FIG. 11). By the embodiment according to the invention of the insulations of the floating gates prior to embodying the actual grids, an etching mask is used having patterns with a ptich greater than the one used to embody the floating gates according to the prior Art. FIG. 11 diagrammatically represents the griu patterns G'1, G'2 of the etching mask according to the prior Art. FIG. 12 represents the lateral insulations of the floating gates. These patterns have a pitch corresponding to the length L of a grid G1 and to the lengh L of a second grid G2 increased by spaces of length X3 respectively separating the grids G1 and G2 and the grid G2 from a grid G3.

All the various stages for producing an integrated memory cell according to the invention are described with reference with FIGS. 3 to 10 which are cutaway views along the axis BB.

The embodiment of the insulations of the floating gates comprises a stage for depositing a sacrificial layer 31 which advantageously is a layer of polycrystalline silicon, followed by a stage for etching this layer by means of the mask defined above, followed by a stage for depositing a nonconducting layer 32 above this etched polycrystalline silicon 31 layer, and finally a stage for etching the nonconductor 32 and the polycrystalline 31 so as to embody spacers 320 with the desired width, namely X3. These spacers 320 are formed from the nonconducting layer 32 which is deposited against the lateral flanks of the patterns 310 of the polycrystalline silicon layer 31.

The sacrificial layer 31 is a layer which is deposited on a substrate, selectively and anisotropically etched with respect to this substrate which receives a new layer, itself able to be etched and which is then completely eliminated.

For this layer, a material is selected which makes it possible to carry out all the above-mentioned depositing and etching operations.

This is why, by way of example in no way restrictive, this layer has been embodied with polycrystalline silicon.

The method for producing an integrated memory cell according to the invention thus comprises the following stages:

(a) firstly:
in, for example, a type p monocrystalline silicon substrate, active zones are formed, said zones being separated by the thick oxide forming the field oxide 18 used to insulate the memory points. The field oxide is embodied by localized oxidation of the substrate through a mask of silicon nitride.

A layer of a material 30 is formed and is used to protect the substrate until the grid oxidation stage (for example, a layer of silicon oxide SiO$_2$) or the silicon nitride mask is used. Doping is carried out in the channel regions by ionic implantation.

Figure 4:
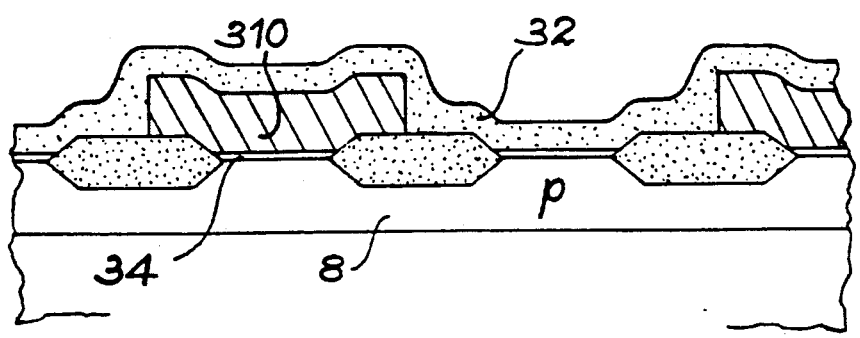

(b) the lateral insulations are then embodied:
in order to achieve this, the sacrificial layer 31 of polycrystalline silicon with a thickness of 500 nm is deposited, this layer being etched from the predefined mask and described with reference to FIG. 11 so as to obtain patterns 310 as shown on FIG. 4.

Then the nonconducting layer 32 is deposited, said layer formed, for example, of silicon oxide SiO$_2$ of 300 nanometers via the chemical vapor phase depositing technique (CVD).

Figure 5:
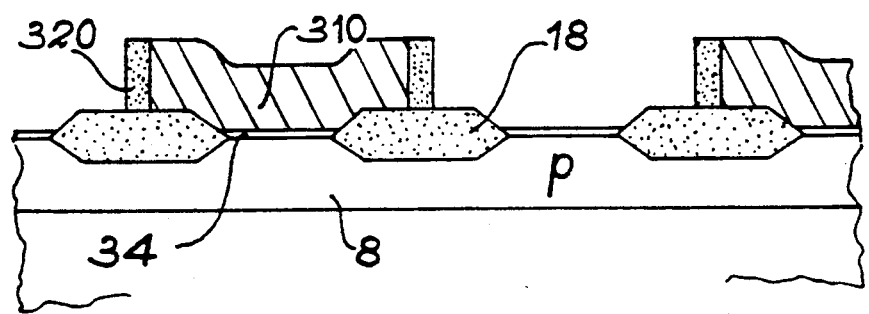
Figure 6:
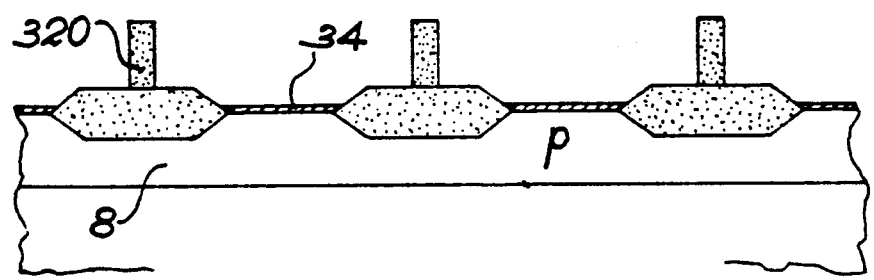
Figure 7:
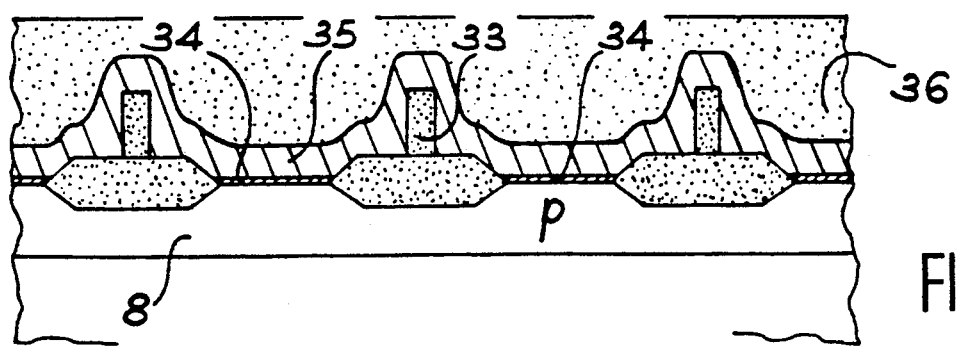

A full plate etching (that is, without the mask) is carried out of this nonconducting layer 32 so as to form spacers 320, as represented on FIG. 5. This etching is carried out with a CHF$_3$ trifluoromethane plasma over the entire thickness of the layer. This makes it possible to leave silicon oxide solely on the flanks of the patterns 310 of the sacrificial layer of polycrystalline silicon.

The polycrystalline silicon patterns 310 are eliminated by a plasma engraving using as a means of dissolution sulphur hexafluoride (SF$_6$). Thus, spacers 320 with a width X3 are obtained, as shown on FIG. 6.

Then the protection layer 30 is eliminated with the aid of diluted hydrofluoric acid. The grid oxide 34 is embodied conventionally by thermal oxidation.

Then a layer of polycrystalline silicon 35 of 250 nanometers is deposited by a CVD or LPCVD chemical vapor phase method. The floating gates of the memory points shall be subsequently embodied in this layer 35.

Then, by means of a conventional technique, a photosensitive layer of resin 36 is deposited effacing the relief of the layer 35. This resin layer 36, known as a planarization layer, has a thickness of about 1400 nanometers. The depositing of this layer can be followed by a heat treatment, for example of heating at a temperature of about 250° C. for half an hour so as to obtain suitable stretching of this layer of resin.

Figure 8:
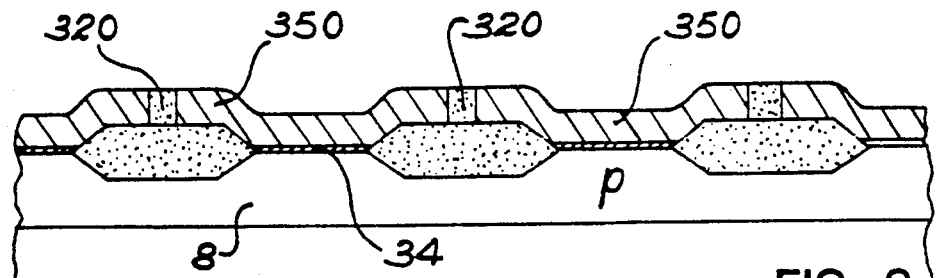
Figure 9:
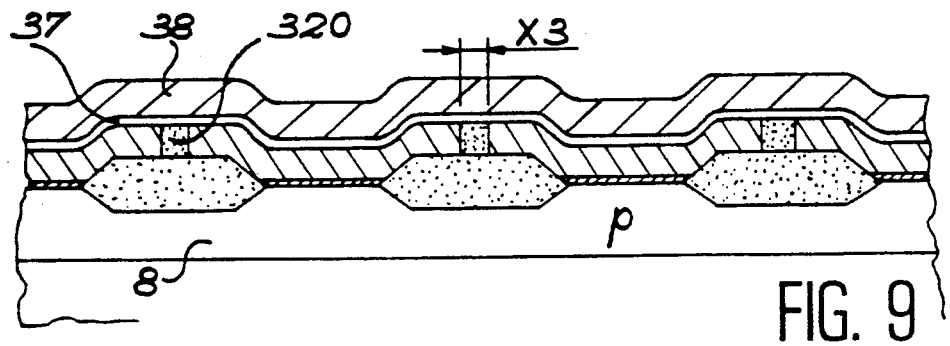

Then an engraving is simultaneously carried out of the resin layer 36 and the polycrystalline layer 35 at identical attack speeds for the resin 36, the polycrystalline silicon 35 and the oxide 350 until the surface of the strips 350, as shown on FIG. 8, is exposed, the remaining height of the spacers 320 then being similar to that of the strips 350.

This engraving is embodied, for example anisotropically, by a reactive ionic etching method using as a means of dissolution a mixture of tri- or tetrafluoromethane and oxygen, the fluorine compounds being used to engrave the polycrystalline silicon and the oxygen being used to engrave the resin.

It is then possible to eliminate any possible resin residues with H$_2$SO$_4$ and H$_2$O$_2$ as means of dissolution.

Depositing of the resin 36 is effected, for example, by hydro-extraction.

Doping of the polycrystalline silicon with phosphorus can be effected immediately after depositing by the diffusion of POCL3.

Doping of the polycrystalline silicon 350 with phosphorus may also be effected after etching which is carried out at identical speed of the resin 36 of the polycrystalline silicon layer 35. Then a nonconducting layer 37 (inter-grid layer) is formed, this layer being, for example, silicon oxide. It is also possible to carry out, for example, a triple-layer type insulation by means of one layer of silicon oxide, one layer of silicon nitride and one layer of silicon oxide. In this case, the first layer of oxide shall have a thickness of 25 nanometers, the layer of silicon nitride shall have a thickness of 15 nanometers and the final layer of oxide shall have a thickness of 5 nanometers.

Deposited on the nonconductor 37 is another layer of polycrystalline silicon 38 doped with phosphorus by the diffusion of POCL3 and in which subsequently embodied shall be the second grids or control grids of the memory points. This layer 38 may be obtained by the CVD or LPCVD chemical vapor phase depositing technique and has a thickness of 400 nanometers. So as to obtain these control grids (corresponding to the words lines), this layer 38 is etched from a mask having defining the widths (according to the axis Y) of the control grids.

At this stage, the widths of the floating gates are not yet defined, only the lengths of these floating gates having been defined. The presence of the spacers 320 has enabled the strips 350 to be obtained in the direction Y.

In the regions not overlapped by the polycrystalline silicon layer 38 in the zones thus not overlapped by the control grids defined above, an etched is made of the patterns 350 obtained from the polycrystalline silicon layer so as to define the width of the floating gates. In order to achieve this, first of all an engraving is made of the spacers 320 and the inter-grid nonconductor 37 in those regions not protected by the polycrystalline silicon layer 38. In fact, a partial etching is made of the silicon oxide 320 forming the spacers over a thickness of 200 nanometers. This etching is carried out anisotropically and selectively with respect to the polycrystalline silicon with the aid of a reactive ionic type etching using $CHF_3$ or $CF_4$ as a means of dissolution. Then an etching is made of the polycrystalline silicon selectively with respect to the silicon oxide 320. This etching is carried out anisotropically with the aid of a reactive inonic type using sulphur hexafluoride ($SF_6$) as a means of dissolution, plus 50% HCL. A partial etching is made of the spacers 320 so that the remaining silicon oxide protects the substrate 8 during etching of the polycrystalline silicon 350. The thin layer of the remaining silicon oxide does not interfere with ionic implantation.

Figure 10:
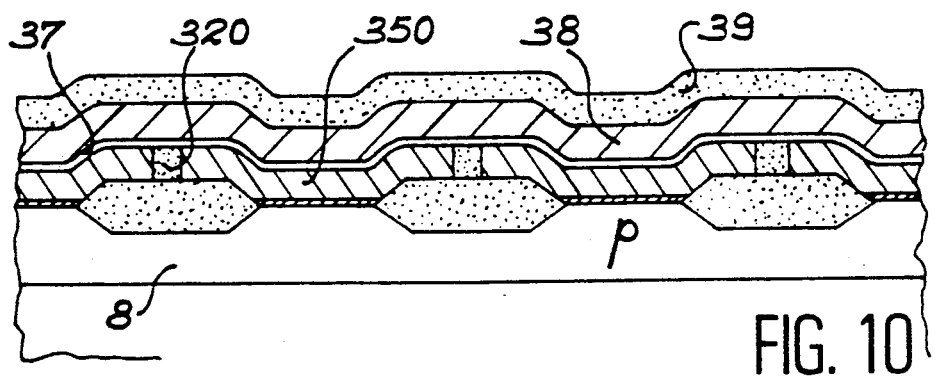

Then by conventional means, a doping is carried out of the sources and drains, followed by a depositing of the nonconductor 39 overlapping the entire memory cell, as shown on FIG. 10. To complete the method, the contacts and interconnections between the memory cells are embodied by conventional means, as can be seen on FIG. 2.

The method according to the invention makes it possible to embody memory cells having submicronic gaps between floating gates.

It makes it possible to significantly improve the evenness of the structure by suppressing the steps formed by the control grids on the floating gates.

It also makes it possible to suppress the small points P, as the angles formed by the interpoly nonconductor and the edges of the floating gates no longer exist in this new structure obtained by the method according to the invention.

Finally, for a given cell dimension, the coupling surface between the control grids and the floating gates is increased by means of this method.

What is claimed is:

1. Method to produce an EPROM or EEPROM type integrated memory cell on a semi-conductive substrate comprising a matrix of memory points electrically insulated from each other, each memory point comprising a source, a drain, a floating gate, a control grid and a channel situated under the floating gate, the source and the drain being situated on both sides of the floating gate, the floating gate of each memory point being laterally distant and insulated along a first direction from one or two other floating gates, said method comprising a stage for forming lateral insulations of the floating gates along the first direction by insulating relief patterns followed by a stage for forming the actual floating gates by depositing and etching.

2. Production method according to claim 1, wherein in order to form the lateral insulations between the floating gates, an etching mask is used comprising
   defining the length of the floating gates, the etching mask used comprising one grid pattern out of two, the pattern of the mask having a pitch, which corresponds to two lengths of floating gates, increased by two lengths of spaces separating two grids.

3. Production method according to claim 1, wherein the formation of the floating gates comprises a stage for depositing a sacrificial layer and then an etching of this layer by means of a mask having one grid pattern out of two, followed by a depositing of an insulating layer and then an etching of the nonconductor so as to form the spacer type insulating relief pattern of the desired submicronic width, and finally eliminating the sacrificial layer.

4. Method according to claim 1, said method comprising the following stages:
   (a) firstly:
      formation in the substrate of active zones separated by the thick oxide forming the field oxide insulating the memory points,
      formation of a layer of material serving to protect the substrate,
      doping of the channel regions by ionic implantation through the protection layer,
   (b) then formation of the lateral insulations by:
      the depositing of the sacrificial layer,
      the etching of this layer so as to obtain the desired patterns,
      the depositing of the thin insulating layer,
      the etching of the nonconductor so as to embody the spacer type insulating relief patterns against the lateral edges of the patterns of the etched sacrificial layer,
      the elimination of the patterns of the sacrificial layer,
      the elimination of the protection layer,
      the formation of a thin layer of an insulating material so as to form a grid oxide,
   (c) formation of the floating gates by depositing and etching,
   (d) formation of the control grids by depositing, masking and etching,
   (e) formation of the sources and drains,
   (f) formation of the contacts,
   (g) formation of the interconnections.

5. Method according to claim 4, wherein the formation of the floating gates comprises the following stages:

depositing of a planarization resin layer, engraving at identical speed the resin and polycrystalline silicon allowing the polycrystalline silicon to be exposed, doping of the first layer of polycrystalline silicon.

6. Method according to claim 4, wherein the sacrificial layer is constituted by polycrystalline silicon.

7. Method according to claim 4, wherein the substrate is silicon and in which the thin layer of insulating material is a silicon oxide formed by oxidation of the substrate.

8. Method according to claim 4, wherein the protection layer is constituted by the nitride mask used to form the field oxide.

9. Method according to claim 5, wherein the doping of the first layer of polycrystalline silicon is carried out immediately after this layer is deposited.

10. Method according to claim 3, wherein the formation of the control grids comprises the following successive stages:

depositing of the insulating inter-grid layer;

depositing of a second layer of polycrystalline silicon;

doping of the second layer of polycrystalline silicon;

etching of this second layer from a mask having patterns defining the control grids;

partial etching of the insulating layer forming the spacers and the inter-grid insulating layer in those zones where these layers are not overlapped by the second layer of polycrystalline silicon;

selective etching of the first layer of polycrystalline silicon with respect to the nonconductor in those zones not overlapped by the second polycrystalline silicon layer.

* * * * *